United States Patent [19]
Kawano

[11] Patent Number: 6,078,197
[45] Date of Patent: Jun. 20, 2000

[54] OUTPUT DRIVER CIRCUIT UTILIZING FLOATING WELLS

[75] Inventor: Harumi Kawano, Miyazaki, Japan

[73] Assignee: Oki Electric Industry Co., Ltd., Tokyo, Japan

[21] Appl. No.: 08/930,127

[22] PCT Filed: Mar. 12, 1997

[86] PCT No.: PCT/JP97/00779

§ 371 Date: Oct. 29, 1997

§ 102(e) Date: Oct. 29, 1997

[87] PCT Pub. No.: WO97/34373

PCT Pub. Date: Sep. 18, 1997

[30] Foreign Application Priority Data

Mar. 13, 1996 [JP] Japan ................................ 8-056204

[51] Int. Cl.$^7$ .......................... H03K 17/16; H03K 19/003
[52] U.S. Cl. .......................... 327/108; 327/109; 327/379; 327/384; 326/58; 326/34
[58] Field of Search .................................. 327/108, 379, 327/384, 109; 326/34, 58

[56] References Cited

U.S. PATENT DOCUMENTS

| | | |
|---|---|---|
| 4,782,250 | 11/1988 | Adams et al. . |
| 5,300,832 | 4/1994 | Rogers . |
| 5,381,062 | 1/1995 | Morris . |
| 5,418,476 | 5/1995 | Strauss .................................. 326/58 |
| 5,546,020 | 8/1996 | Lee et al. . |

FOREIGN PATENT DOCUMENTS

| | | |
|---|---|---|
| 6-216752 | 8/1994 | Japan . |
| 07297701 | 11/1995 | Japan . |
| 8-8715 | 1/1996 | Japan . |
| 08237102 | 9/1996 | Japan . |
| WO 94/29961 | 12/1994 | WIPO . |

OTHER PUBLICATIONS

"Improved N–Well Control for the PMOS Pull–Up Device in Off–Chip Driver" IBM Technical Disclosure Bulletin, vol. 36, No. 1, Jan. 1, 1993, pp. 45–46, XP000333767.

*Primary Examiner*—Timothy P. Callahan
*Assistant Examiner*—April Giles
*Attorney, Agent, or Firm*—Jones Volentine, L.L.P.

[57] ABSTRACT

An output circuit which suppresses the occurrence of leakage current from the power supply of an external element to the power supply of an internal device, even if the power supply voltage of the external element is higher than the power supply voltage of the internal device. Even if a voltage (5V) from an external circuit etc. which is higher than a power supply terminal 6 voltage (3V) is input to the output terminal 8, due to the fact that a floating state N-well B1 at the substrate of PMOS transistors P12, P13 and P14 rises to around 5V, PMOS transistor P12 and PMOS transistor P13 are put into an OFF state. If PMOS transistor P12 and PMOS transistor P13 are in the OFF state, the (5V) voltage is applied to PMOS transistor P1 and there is no flow of leakage current to the power supply terminal 6 through the substrate of PMOS transistor P1. Also, the floating state N-well B1 at the substrate of PMOS transistors P12, P13 and P14 is not itself connected to the 3V power supply terminal 6, and so it is possible to prevent the flow of leakage current from the output terminal 8 to the power supply terminal 6.

32 Claims, 6 Drawing Sheets

OUTPUT DRIVER CIRCUIT UTILIZING FLOATING WELLS

TECHNICAL FIELD

The present invention relates to a semiconductor integration circuit, and in particular to an output circuit using a MOS transistor.

BACKGROUND ART

A conventional output circuit for a semiconductor integration circuit is shown in FIG. 8. This conventional output circuit will be described below using FIG. 8.

The conventional output circuit is comprised of a signal input terminal 1, an enable signal terminal 2, an inverter 3, a 2-input NAND circuit 4, a 2-input NOR circuit 5, a PMOS transistor P1, an NMOS transistor N1, a power supply terminal 6 supplied with a 3V power supply potential, a ground terminal 7 supplied with a ground potential, and an output terminal 8.

Signal input terminal 1 is connected to one input terminal of each of the 2-input NAND circuit 4 and the 2-input NOR circuit 5. The enable signal input terminal 2 is connected to the other input terminal of the 2-input NAND circuit 4 and the input terminal of the inverter circuit 3. The output terminal of the inverter circuit 3 is connected to the other input terminal of the 2-input NOR circuit 5. The output terminal of the 2-input NAND circuit 4 is connected to the gate electrode of the PMOS transistor P1, while the output terminal of the 2-input NOR circuit 5 is connected to the gate electrode of the NMOS transistor N1. The PMOS transistor P1 is connected between the power supply terminal 6 (3V) and the output terminal 8. The N-well in the substrate of the PMOS transistor P1 is connected to the 3V power supply terminal 6. The NMOS transistor N1 is connected between the ground terminal 7 and the output terminal 8, while the substrate of NMOS transistor N1 (P-well) is connected to the ground terminal 7.

The operation of this circuit will now be described. First of all, when an 'L' level signal (0V) is input to the enable signal input terminal 2 as an input signal, the output of the 2-input NAND circuit 4 becomes an 'H' level and the output of the 2-input NOR circuit 5 becomes an 'L' level. Accordingly, the PMOS transistor P1 and the NMOS transistor N1 are turned off. As a result of this, the output terminal 8 is in a floating state totally unrelated to an input signal to the signal input terminal 1.

Next, when an 'H' level signal is input to the enable signal input terminal 2 as an input signal, if an 'L' level signal is input to the signal input terminal 1 the PMOS transistor P1 is turned off and the NMOS transistor N1 is turned on. As a result, the output terminal 8 outputs an 'L' level signal. On the other hand, if an 'H' level signal is input to the signal input terminal 1, the PMOS transistor P1 is turned on and the NMOS transistor N1 is turned off. As a result, the output terminal 8 outputs an 'H' level signal.

However, in the conventional output circuit such as that in FIG. 8, when the output terminal 8 is connected to an external element having a power supply voltage higher than 3V, for example a bus etc. supplying signals of 5V, there are circumstances in which the 5V voltage can be applied to the output terminal 8 while the output terminal 8 is in the floating state. If a 5V voltage is applied to the output terminal 8, the drain (P active) of the PMOS transistor P1 becomes 5V. Because the substrate (N-well) of this PMOS transistor P1 is connected to the 3V power supply terminal 6, the diode across the drain (P active) and the substrate (N-well) is forward biased, and so current flows in this diode across the drain and the substrate. This means that if a voltage of 5V is applied to the output terminal 8 due to the influence of the bus etc. having a 5V signal supplied to it, there is a possibility of leakage current of a number of mA flowing in the path from the bus supplied with a 5V signal, to the output terminal 8, to the drain of the PMOS transistor P1, to the substrate of the PMOS transistor P1, to power supply terminal 6 of the output circuit. The object of the present invention is to improve this problem.

SUMMARY OF THE INVENTION

An example of the present invention comprises a first MOS transistor having a gate connected to a first node, one terminal connected to a first power supply terminal having a first potential, and another terminal connected to a second node; a second MOS transistor, formed inside a floating state well, and having a gate connected to the first node, one terminal connected to the second node, and another terminal connected to an output terminal; and a third MOS transistor, formed inside the floating state well, and having a gate connected to the first power supply terminal having the first potential, one terminal connected to the first node, and another terminal connected to the output terminal.

As a result of the above described configuration, when a voltage from an external circuit etc. for example 5V) which is higher tnan a power supply terminal voltage (for example 3V) is input to the output terminal, a floating state well rises to around the high potential input from the external circuit etc. As a result, a second transistor formed inside the well is turned off and the high voltage input from the external device is not applied to the first transistor. Also, the floating state well at the substrate of the second transistor is not itself connected to the power supply terminal, and so it is possible to prevent the flow of leakage current from the output terminal to the power supply terminal.

BEST MODE FOR PRACTICING THE INVENTION

Figure 1:
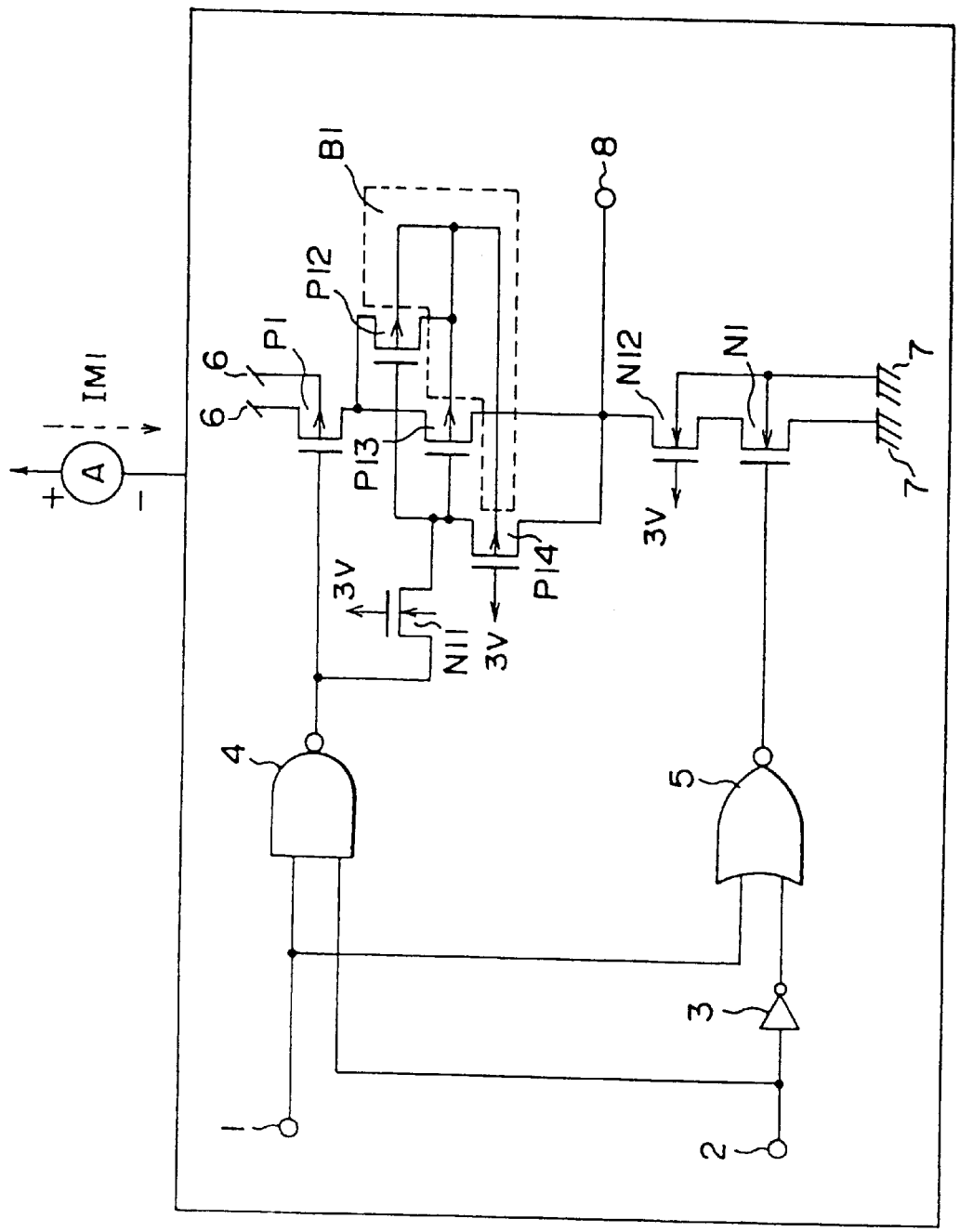
FIG. 1 is a circuit diagram showing a first embodiment of the present invention.
Figure 8:
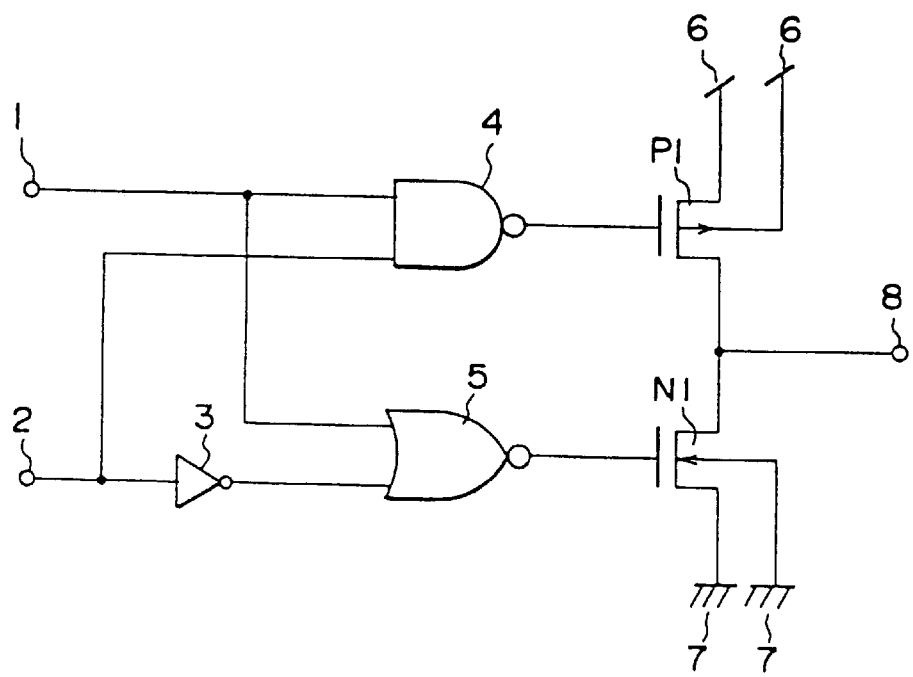
FIG. 8 is a circuit diagram showing a conventional output circuit.

FIG. 1 shows an output circuit of a first embodiment of the present invention. Parts that are the same as in FIG. 8 have the same reference numerals attached thereto. The output circuit of the present invention will now be described below.

The signal input terminal 1 is respectively connected to one input terminal of the 2-input NAND circuit 4 and the 2-input NOR circuit 5, while the enable signal input terminal 2 is connected to the other input terminal of the 2-input NAND circuit 4 and the input terminal of the inverter circuit 3. The output of the inverter circuit 3 is connected to the other input terminal of the 2-input NOR circuit 5. The output terminal of the 2-input NAND circuit 4 is connected to the gate electrode of the PMOS transistor P1 and the source of the NMOS transistor N11. The source of the PMOS transistor P1 is connected to the power supply terminal 6 (3V), while the drain of the PMOS transistor P1 is connected to the source of PMOS transistor P12 and the source of PMOS transistor P13. The gate electrode of NMOS transistor N11 is connected to the power supply terminal 6 (3V), while the drain of NMOS transistor N11 is connected to the gate electrodes of PMOS transistor P12 and PMOS transistor P13 and the source of PMOS transistor P14. The drain of PMOS transistor P12 is connected to N-well B1 in the substrate of PMOS transistor P12, PMOS transistor P13, and PMOS transistor P14. This N-well B1 in the substrate of PMOS transistor P12, PMOS transistor P13, and PMOS transistor P14 is not connected to the power supply terminal 6 (3V), and the whole of the well is in a floating state. In other words, the PMOS transistors P12, P13 and P14 are transistors formed inside the floating state N-well B1. The drain of PMOS transistor P13 and the drain of PMOS transistor P14 are connected to the output terminal 8. The gate electrode of PMOS transistor P14 is connected to the power supply terminal 6 (3V). The output terminal of the 2-input NOR circuit 5 is connected to the gate electrode of the NMOS transistor N1, with the source of NMOS transistor N1 being connected to the ground terminal 7 while the drain of NMOS transistor N1 is connected to the source of NMOS transistor N12. The drain of NMOS transistor N12 is connected to the output terminal 8, while the gate electrode of NMOS transistor N12 is connected to the power supply terminal 6 (3V). The substrate of PMOS transistor P1 is connected to the power supply terminal 6 (3V).

The circuit operation will now be described.

First of all, when an 'L' level signal (0V) is input to the enable signal input terminal 2 as an input signal, the output of the 2-input NAND circuit 4 becomes an 'H' level (3V) and the PMOS transistor P1 is turned off. Because the 'H' level input signal is also input to the 2-input NOR circuit 5 through the inverter circuit 3, the output of the 2-input NOR circuit 5 becomes an 'L' level, which causes the NMOS transistor N1 to be turned off. Therefore, when the input signal to the enable signal input terminal 2 is an 'L' level, PMOS transistor P1 and NMOS transistor N1 are both off together, and the output terminal 8 is in a floating state with no relationship to an input signal at the signal input terminal 8.

In this state, when 5V is applied to the output terminal 8 from an external power terminal etc., (for example, when a bus to which the output terminal 8 is connected becomes 5V) diodes across the drain and substrate of PMOS transistor P13 and the drain and substrate of PMOS transistor P14 are forward biased. Accordingly, current flows from a drain P active region to a substrate N-well B1, and the potential of the floating state N-well rises to around 5V.

Because the potential of the N-well rises to around 5V, the substrate potential is higher than the gate potential of the PMOS transistor P14 (3V). Accordingly, the PMOS transistor P14 is turned on and forms a channel. Because the PMOS transistor P14 is turned on, the potential of the source of PMOS transistor P14 also becomes the same as the voltage applied to the output terminal 8 (5V).

The gate potential of the PMOS transistors P12 and PMOS transistor P13 connected to the source of PMOS transistor P14 also become 5V. As a result, the PMOS transistors P12 and P13 cancel any difference between the potential of the N-well B1 in the substrate and the gate potential. This means that the PMOS transistors P12 and P13 are turned off and do not form a channel.

Because the PMOS transistors P12 and P13 are off the 5V supplied to the output terminal 8 is not transferred to the PMOS transistor P1. There is therefore no flow of leakage current through the substrate of PMOS transistor P1.

Also, the N-well B1 in the substrate of PMOS transistor P12 and PMOS transistor P13 is in a floating state and is not in connection with the 3V power supply terminal 6. That is, there is no worry of leakage current flowing to the power supply terminal 6, because of the diodes across the drain and substrate of PMOS transistor P12 and PMOS transistor P13.

The NMOS transistor N11 also exists between the source of PMOS transistor P14 and the output of the 2-input NAND circuit 4. When the output terminal 8 is floating, the gate potential and source potential of the NMOS transistor N11 are the same, because the output of the 2-input NAND circuit 4 is an 'H' level, and the NMOS transistor N11 is off. 5V supplied to the output terminal 8 is therefore not supplied to the output of the 2-input NAND circuit 4 through NMOS transistor N14. That is, there is no fear of leakage current flowing through transistors included inside the 2-input NAND circuit 4.

Figure 3:
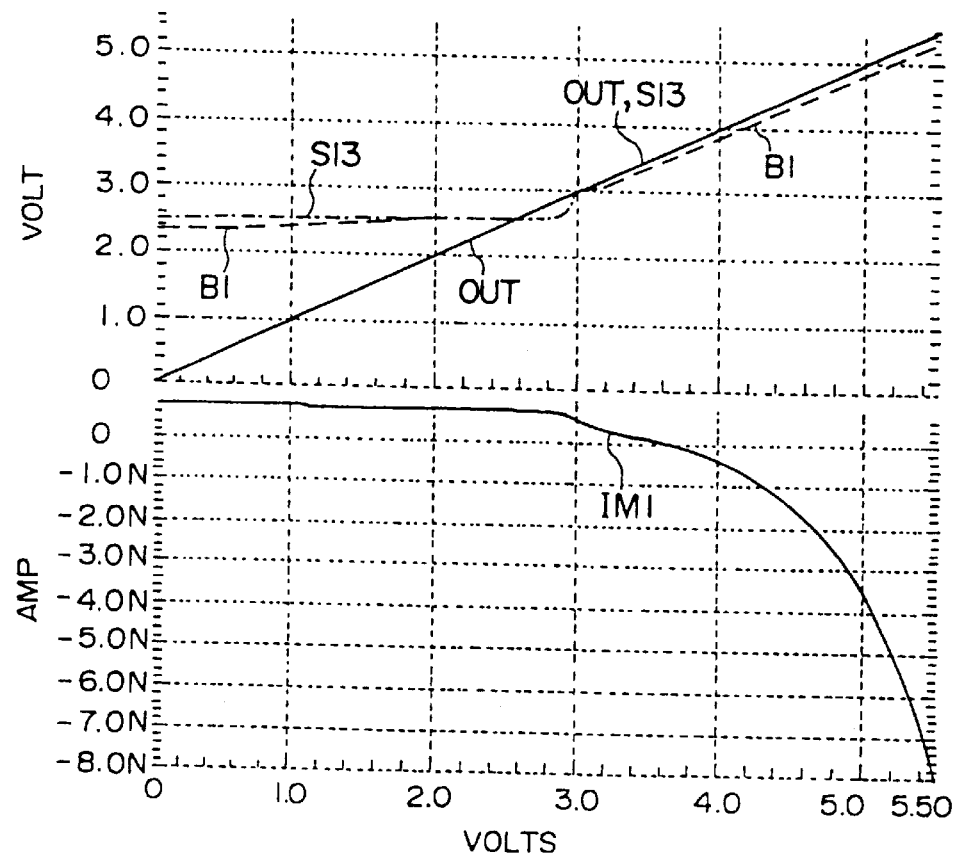
FIG. 3 is a diagram showing the relationship between the voltage supplied to the output terminal 8 and the leakage current, in the first embodiment of the present invention.

The upper part of FIG. 3 shows voltage variation of the floating state N-well and the variation in potential (S13) supplied to the gate electrodes of PMOS transistor P12 and PMOS transistor P13 when the voltage supplied to the output terminal 8 (OUT) is caused to vary from 0 to 5.5V. The lower part of FIG. 3 shows electric current observed from the side of the power supply terminal 6 (3V) of this circuit as IM1. As has been described above, when 5V is applied to the output terminal 8, the potential of the floating state N-well rises to about 5V. Also, S13 supplied to the gate electrodes of PMOS transistor P12 and PMOS transistor P13 become 5V. The current IM1 flowing in the circuit is around 8nA. It will be understood that this is small compared to the figure of a number of mA in the conventional art.

Next, when an 'H' level signal is input to the enable signal input terminal 2 as an input signal, if an 'L' level signal is input to the signal input terminal 1 as an input signal the output of the 2-input NAND circuit 4 becomes an 'H' level. Accordingly, the PMOS transistor P1 is turned off. Because the 2-input NOR circuit 5 also has an 'L' level input to one of its input terminals, the output is an 'H' level. The NMOS transistor N1 is therefore turned on. As a result, the output terminal 8 outputs an 'L' level signal.

If an 'H' level signal is input to the signal input terminal 1 as an input signal, the output of the 2-input NAND circuit 4 becomes an 'L' level and the PMOS transistor P1 is turned on. The output of the 2-input NOR circuit 5 becomes an 'L' level and the NMOS transistor N1 is turned off. The NMOS transistor N11 is also turned off, which means that the 'L' level signal at the output of 2-input NAND circuit 4 is supplied to the gate electrodes of the PMOS transistor P12 and the PMOS transistor P13. Because there is a diode across the source and substrate of PMOS transistor P12 and the PMOS transistor P13, when the potential of the N-well B1 of the substrate is lower than 3V this diode becomes forward biased, and current flows in the diodes across the source and substrate. The potential of the N-well B1 in the substrate of PMOS transistor P12, PMOS transistor P13 and PMOS transistor P14 rises to around 3V due to this current. As a result, the potential of the substrate is higher relative to the gate potential of the PMOS transistor P12 and the PMOS transistor P13. A channel is formed in the PMOS transistor P12 and the PMOS transistor P13 and they are turned ON. By turning the PMOS transistor P12 on, the potential of the floating N-well B1 is reliably caused to rise to 3V, with the effect that the operation of the PMOS transistor P13 is made more stable. As a result of the above described operation, the output 8 outputs an 'H' level (3V) signal.

Figure 4:
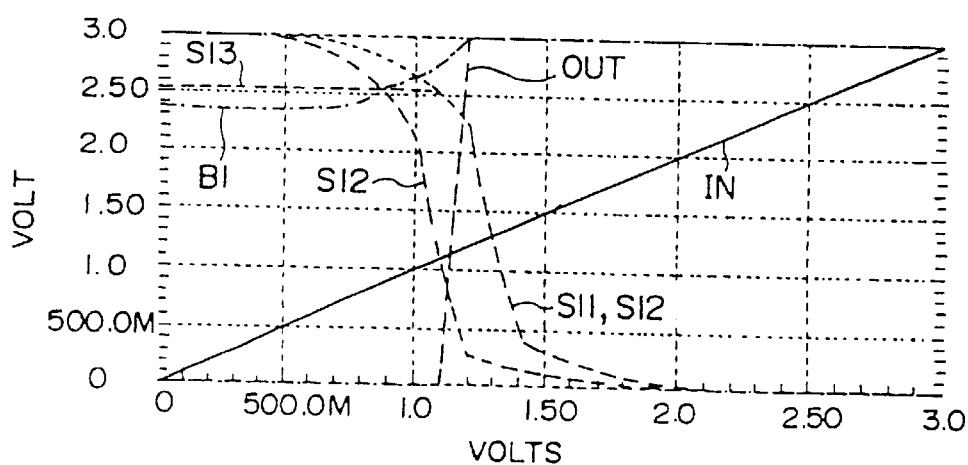
FIG. 4 is a diagram showing the relationship between the voltage supplied to the signal input terminal and the voltage of each section, in the first embodiment of the present invention.

FIG. 4 shows the potential of the output terminal 8 (OUT), the gate potential of the PMOS transistor P1 (S11), the gate potential of the NMOS transistor N1 (S12), the gate potential of the PMOS transistor P12 and the PMOS transistor P13 (S13), and the potential of the floating state N-well B1, when the potential supplied to the signal input terminal 1 (IN) is caused to vary from 0 to 3V (L to H) with an 'H' level being input to the enable signal input terminal 2. As shown in the diagram, with the signal IN supplied to the signal input terminal 1 at an 'L' level, the output terminal 8 outputs an 'L' level signal as OUT, and with IN at an 'H' level the output terminal 8 outputs an 'H' level signal as OUT.

In this circuit, when a voltage of 5V is applied to the output terminal 8 this 5V voltage is passed directly to the NMOS transistor N1 etc., and the NMOS transistor N12 functions to prevent damage to the NMOS transistor N1 etc.

According to the output circuit of the first embodiment of the present invention, for every input signal supplied to the input terminals, the same output signals are output from the output terminal 8 as in the conventional art. On the other hand, when a potential (5V) higher than the potential of the power supply terminal 6 (3V) is input to the output terminal 8 from an external circuit etc., the PMOS transistor P12 and the PMOS transistor P13 are put into the OFF state as a result of the fact that the potential of the floating state N-well B1 at the substrate of PMOS transistors P12, P13 and P14 rises to around 5V. As a result, if the PMOS transistor P12 and the PMOS transistor P13 are turned off, the 5V potential is applied to the PMOS transistor P1 and there is no leakage current flowing from the drain of PMOS transistor P1 through the substrate to the power supply terminal 6. Further, since the floating state N-well B1 at the substrate of PMOS transistors P12, P13 and P14 is not itself connected to the 3V power supply terminal 6, the flow of leakage current from the output terminal 8 to the power supply terminal 6 can be prevented. It is also possible to prevent the flow of leakage current via the 2-input NAND circuit 4, because the NMOS transistor N11 is turned off.

Figure 2:
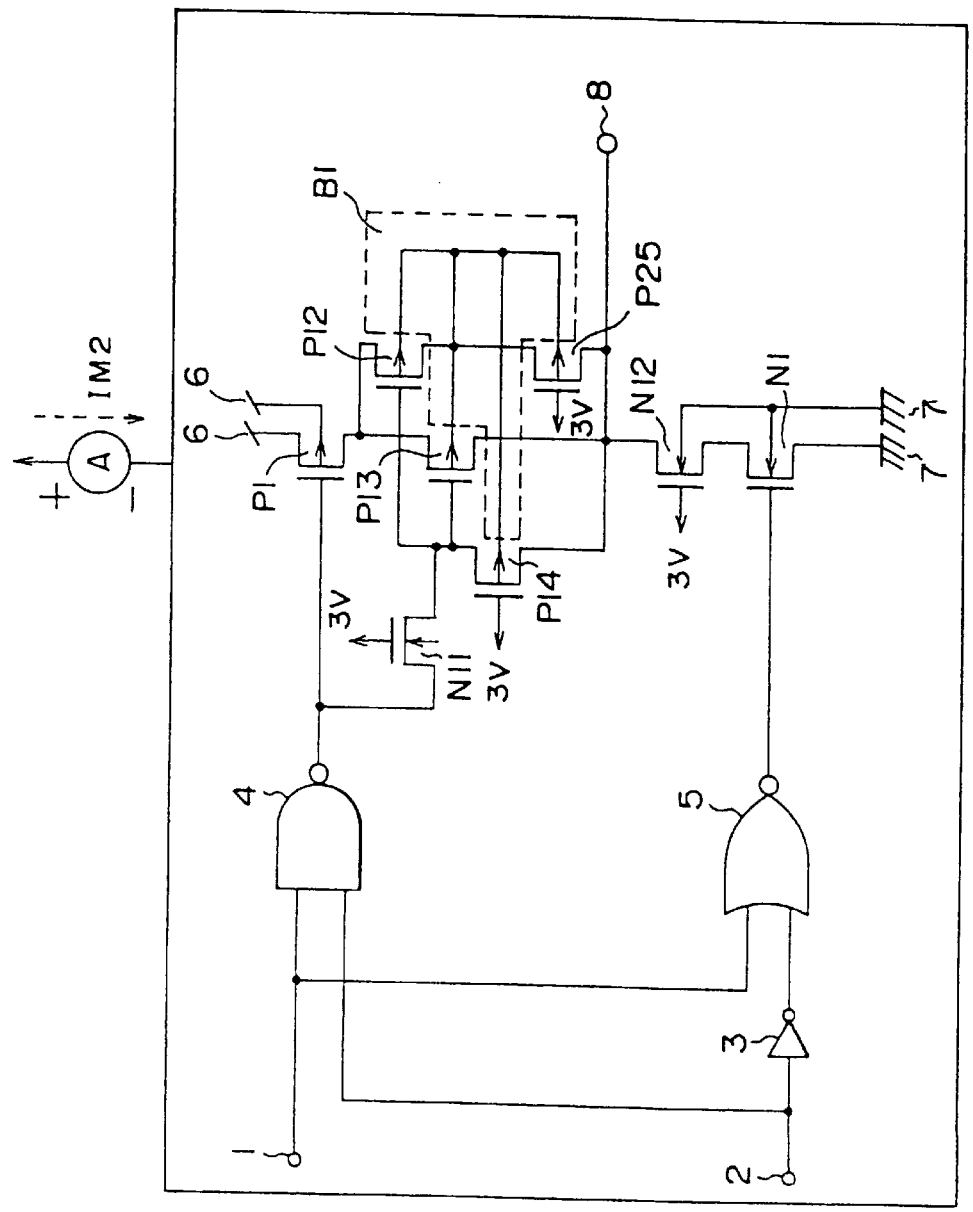
FIG. 2 is a circuit diagram showing a second embodiment of the present invention.

FIG. 2 is a circuit diagram showing an output circuit of a second embodiment of the present invention. Parts which are the same as those in FIG. 1 have the same reference numerals attached thereto. The output circuit of the second embodiment will be described using FIG. 2.

The signal input terminal 1 is respectively connected to one input terminal of each of the 2-input NAND circuit 4 and the 2-input NOR circuit 5, while the enable signal input terminal 2 is connected to the other input terminal of the 2-input NAND circuit 4 and the input terminal of the inverter circuit 3. The output of the inverter circuit 3 is connected to the other input terminal of the 2-input NOR circuit 5. The output terminal of the 2-input NAND circuit 4 is connected to the gate electrode of the PMOS transistor P1 and the source of the NMOS transistor N11. The source of the PMOS transistor P1 is connected to the power supply terminal 6 (3V), while the drain of the PMOS transistor P1 is connected to the source of PMOS transistor P12 and the source of PMOS transistor P13. The gate electrode of NMOS transistor N11, while the drain of NMOS transistor N11 is connected to the gate electrodes of PMOS transistor P12 and PMOS transistor P13 and the source of PMOS transistor P14. The drain of PMOS transistor P12 is connected to the N-well B1 at the substrate of PMOS transistor P12, PMOS transistor P13, PMOS transistor P14 and PMOS transistor P25, and this N-well is in a floating state, the same as in the first embodiment. That is, in the second embodiment, the PMOS transistor P12, PMOS transistor P13, PMOS transistor P14 and PMOS transistor P25 are formed within the floating state N-well B1. The source of PMOS transistor P25 is connected to this floating state N-well B1. The drains of PMOS transistors P13, P14 and P25 are connected to the output terminal 8. The gate electrodes of PMOS transistor P14 and the PMOS transistor P25 are connected to the power supply terminal 6 (3V). The output terminal of the 2-input NOR circuit 5 is connected to the gate electrode of the NMOS transistor N1, while the source of the NMOS transistor N1 is connected to the ground terminal 7 and the drain of the NMOS transistor N1 is connected to the source of NMOS transistor N12. The drain of NMOS transistor N12 is connected to the output terminal 8, while the gate electrode of NMOS transistor N12 is connected to the power supply terminal 6 (3V). The substrate of PMOS transistor P1 is connected to the power supply terminal 6.

Next, the operation of this circuit will be described.

First of all, when an 'L' level signal (0V) is input to the enable signal input terminal 2, the output of the 2-input NAND circuit 4 becomes an 'H' level (3V) and the PMOS transistor P1 is turned off. Because the 'H' level input signal is also input to the 2-input NOR circuit 5 through the inverter circuit 3, the output of the 2-input NOR circuit 5 becomes an 'L' level and the NMOS transistor N1 is turned off. Therefore, when the input signal to the enable signal input terminal 2 is an 'L' level, PMOS transistor P1 and NMOS transistor N1 are both off together, and the output terminal 8 is in a floating state with no relationship to an input signal at the signal input terminal 1.

In this state, when 5V is applied to the output terminal 8 from an external power terminal etc., (for example, when a bus to which the output terminal 8 is connected becomes 5V) a forward bias voltage is applied to diodes across the substrate and the drains of PMOS transistor P13, PMOS transistor P14 and PMOS transistor P25, and current flows in these diodes. As a result, the potential of the N-well B1 in the substrate rises to around 5V. As a result of the potential of the N-well B1 having risen to around 5V, because the gate potentials of PMOS transistor P14 and PMOS transistor P25 are 3V, the substrate potential is relatively higher and the PMOS transistor P14 and PMOS transistor P25 are turned on. Because the PMOS transistor P14 is no, 5V applied to the output terminal appears at the source of PMOS transistor P14, and the gate electrodes of PMOS transistor P12 and PMOS transistor P13 connected to the source of PMOS transistor P12 become 5V. The PMOS transistor P25 is also turned on, which means that the potential of the N-well B1 becomes 5V and not around 5V (5-α) as in the first embodiment, and the potential of the N-well B1 of the substrate and the gate potential of PMOS transistors P12 and P13 are all set to the same potential. As a result, the PMOS transistor P12 and the PMOS transistor P13 are turned on with a more stable operation than in the first embodiment. If the PMOS transistor P12 and the PMOS transistor P13 are turned on, the 5V supplied to the output terminal 8 is transmitted to PMOS transistor P1 and there is no leakage current flowing through the substrate of the PMOS transistor P1. In this second embodiment, because the N-well B1 in the substrate of PMOS transistors P12, P13 and P25 is in a floating state, similarly to the first embodiment, there is also no worry of leakage current flowing to the power supply terminal 6 through the N-well B1 of the substrate, due to the diodes across the drains of PMOS transistors P12, P13 and P25 and the substrate.

The NMOS transistor N11 also exists between the source of PMOS transistor P14 and the output of the 2-input NAND circuit 4. When the output terminal 8 is floating, the gate potential and source potential of the NMOS transistor N11 are the same, because the output of the 2-input NAND circuit 4 is an 'H' level, and the NMOS transistor N11 is off. 5V supplied to the output terminal 8 is therefore not supplied to the output terminal of the 2-input NAND circuit 4 through NMOS transistor N14. That is, there is no fear of leakage current flowing through transistors included inside the 2-input NAND circuit 4.

Figure 5:
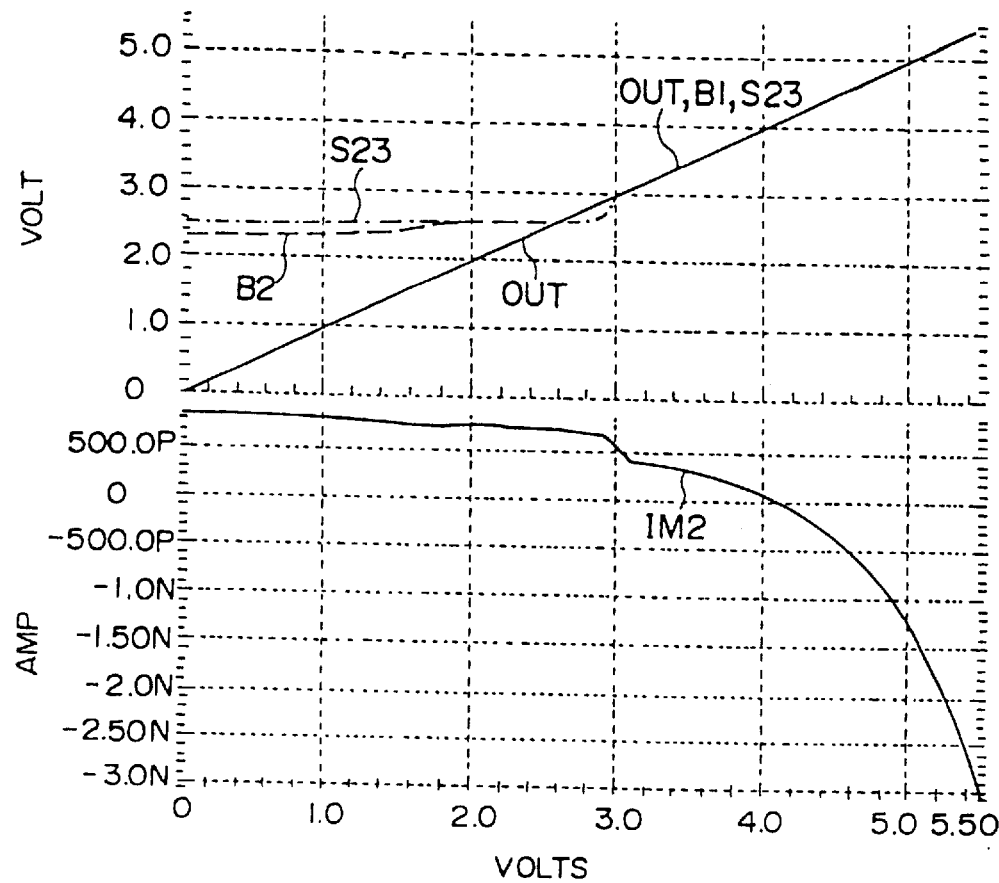
FIG. 5 is a diagram showing the relationship between the voltage supplied to the output terminal 8 and the leakage current, in the second embodiment of the present invention.

The upper part of FIG. 5 shows voltage variation of the floating state N-well and the variation in potential (S23) supplied to the gate electrodes of PMOS transistor P12 and PMOS transistor P13 when the voltage supplied to the output terminal 8 (OUT) is caused to vary from 0 to 5.5V. The lower part of FIG. 5 shows electric current observed from the side of the power supply terminal (3V) of this circuit as IM2. As has been described above, when 5V is added to the output terminal 8, the potential of the floating state N-well rises to 5V. Also, the same 5V voltage is supplied to the gate electrodes of PMOS transistor P12 and PMOS transistor P13. As a result, the operation of the circuit in which the potentials supplied to the substrate and the gate coincide perfectly is more stable, and current IM2 flowing in the circuit is around 3nA, which it will be understood is even smaller than in the first embodiment.

Next, when an 'H' level signal is input to the enable signal input terminal 2 as an input signal, if an 'L' level signal is input to the signal input terminal 1 as an input signal the output of the 2-input NAND circuit 4 becomes an 'H' level and the PMOS transistor P1 is turned off. Because the 2-input NOR circuit 5 also has an 'L' level input to one of its input terminals, the output is an 'H' level and the NMOS transistor N1 is turned on. As a result of this, the output terminal 8 outputs an 'L' level (0V) signal.

If an 'H' level is input to the signal input terminal 1 as an input signal, the output of the 2-input NAND circuit 4 becomes an 'L' level and the PMOS transistor P1 is turned on. The output of the 2-input NOR circuit 5 becomes an 'L' level and the NMOS transistor N1 is turned off. Also, because the NMOS transistor N11 is turned on, the 'L' level at the output of the 2-input NAND circuit 4 is supplied to the gate electrodes of the PMOS transistor P12 and the PMOS transistor P13. Because of the diodes across the sources of PMOS transistor P12 and the PMOS transistor P13, the potential of the N-well B1 in the substrate of PMOS transistors P12, P13 and P14 rises to around 3V, which means that the potential of potential of the substrate is relatively higher than the PMOS transistor P12 and the PMOS transistor P13 and PMOS transistor P12 and PMOS transistor P13 are both turned ON. As a result, the output terminal 8 outputs an 'H' level (3V) signal.

Figure 6:
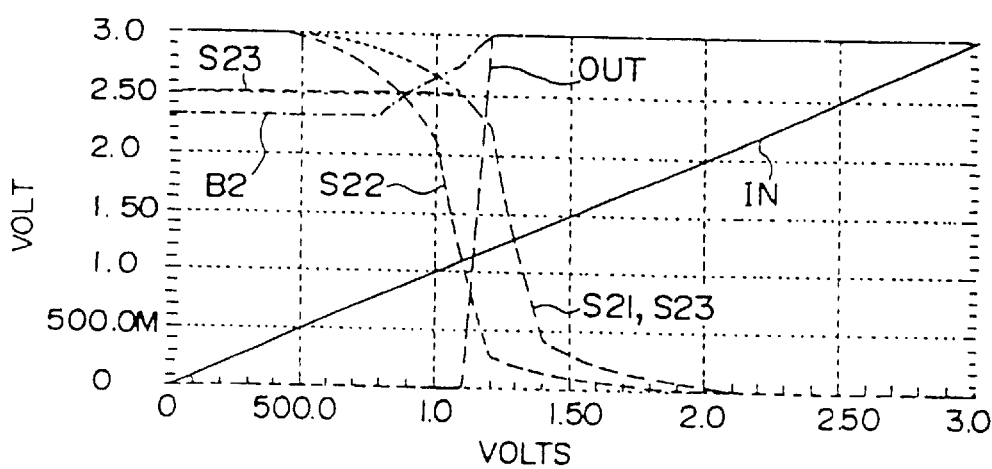
FIG. 6 is a diagram showing the relationship between the voltage supplied to the signal input terminal and the voltage of each section, in the second embodiment of the present invention.

FIG. 6 shows the potential of the output terminal 8 (OUT), the gate potential of the PMOS transistor P1 (S21), the gate potential of the NMOS transistor N1 (S22), the gate potential of the PMOS transistor P12 and the PMOS transistor P13 (S23), and the potential of the floating state N-well B1, when the potential supplied to the signal input terminal 1 (IN) is caused to vary from 0 to 3V (L to H) with an 'H' level being input to the enable signal input terminal 2. As shown in the diagram, with the signal IN supplied to the signal input terminal 1 at an 'L' level, the output terminal 8 outputs an 'L' level signal as OUT, and with IN at an 'H' level the output terminal 8 outputs an 'H' level signal as OUT.

According to the output circuit of the second embodiment of the present invention, for every input signal supplied to the signal input terminals, the same output signals are output from the output terminal 8 as in the conventional art. Also, even if a potential (5V) higher than the potential of the power supply terminal 6 is input to the output terminal 8 from an external circuit etc., the N-well B1 at the substrate of PMOS transistor P12 and PMOS transistor P13 rises to 5V which is the same potential as the gate potential of PMOS transistor P12 and PMOS transistor P13, because of the function of PMOS transistor P25. Because of this, operation of the PMOS transistor P12 and the PMOS transistor P13 is carried out more stably than in the first embodiment, and the flow of leakage current from the output terminal 8 to the power supply terminal 6 can be prevented. Also, because of the NMOS transistor N11, there is no fear of leakage current flowing through the 2-input NAND circuit 4.

Figure 7:
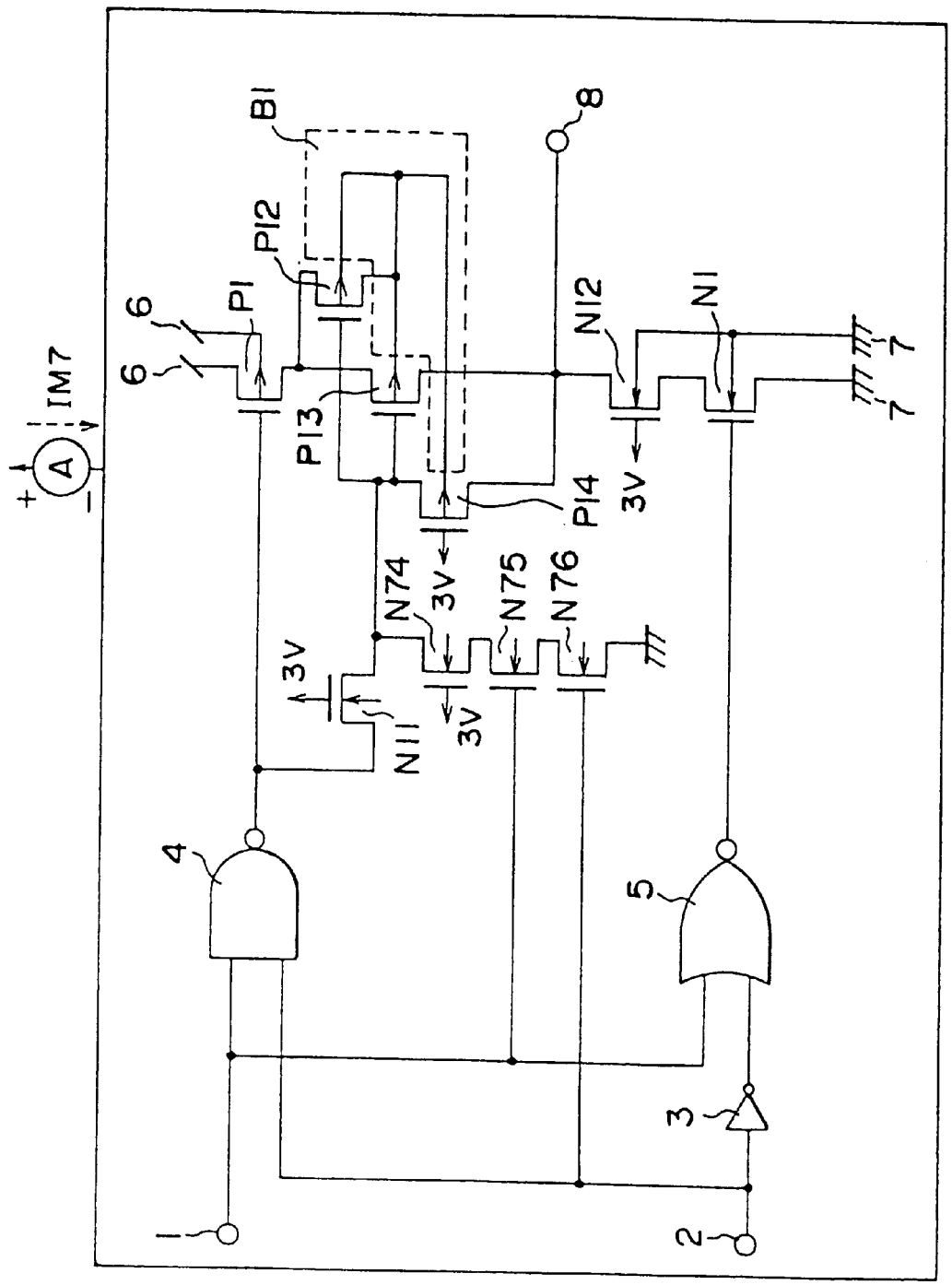
FIG. 7 is a circuit diagram showing a third embodiment of the present invention.

FIG. 7 is a circuit diagram showing an output circuit of a third embodiment of the present invention. Parts which are the same as those in FIG. 1 and FIG. 2 have the same reference numerals attached thereto. The output circuit of the present invention will be described using FIG. 7.

The signal input terminal 1 is respectively connected to one input of each of the 2-input NAND circuit 4 and the 2-input NOR circuit 5 and to the gate electrode of NMOS transistor N75, while the enable signal input terminal 2 is connected to the other input terminal of the 2-input NAND circuit 4, the input terminal of the inverter circuit 3 and the gate electrode of NMOS transistor N76. The output terminal of the inverter circuit 3 is connected to the other input terminal of the 2-input NOR circuit 5. The output terminal of the 2-input NAND circuit 4 is connected to the gate electrode of PMOS transistor P1 and the source of NMOS transistor N11. The source of PMOS transistor P1 is connected to the power supply terminal 6 (3V), and the drain of PMOS transistor P1 is connected to the source of PMOS transistor P12 and the source of PMOS transistor P13. The drain of NMOS transistor N11 is connected to the gate electrodes of the PMOS transistor P12 and the PMOS transistor P13, as well as the source of PMOS transistor P14 and the drain of NMOS transistor N74. The source of NMOS transistor N74 is connected to the drain of NMOS transistor N75. The source of NMOS transistor N75 is connected to drain of NMOS transistor N76, and the source of NMOS transistor N76 is connected to the ground terminal 7. The drain of PMOS transistor P12 is connected to the floating state N-well at the substrate of PMOS transistors P12, P13 and P14, while the drain of PMOS transistor P13 and the drain of PMOS transistor P14 are connected to the output terminal 8. The gate electrode of the PMOS transistor P14 is connected to the power supply terminal 6 (3V). The output terminal of the 2-input NOR circuit 5 is connected to the gate electrode of NMOS transistor N1, while the source of NMOS transistor N1 is connected to the ground terminal 7 and the drain of NMOS transistor N1 is connected to the source of NMOS transistor N12. The drain of NMOS transistor N12 is connected to the output terminal 8, and the gate of NMOS transistor N12 is connected to the power supply terminal 6 (3V). The substrate of PMOS transistor P1 is connected to the power supply terminal 6.

Next, the operation of the circuit will be described.

First of all, when an 'L' level signal is input to the enable signal input terminal 2 as an input signal, the output of the 2-input NAND circuit 4 becomes an 'H' level and the PMOS transistor P1 is turned off. Because the 'H' level input signal is also input to the 2-input NOR circuit 5 through the inverter circuit 3, the output of the 2-input NOR circuit 5 becomes an 'L' level and the NMOS transistor N1 is turned off. Therefore, when the input signal to the enable signal input terminal 2 is an 'L' level, PMOS transistor P1 and NMOS transistor N1 are both off together, and the output terminal 8 is in a floating state with no relationship to an input signal at the signal input terminal 1.

In this state, when 5V is applied to the output terminal 8 from an external power terminal etc., (for example, when a bus to which the output terminal 8 is connected becomes 5V) a forward bias voltage is applied to diodes across the substrate and the drains of PMOS transistor P13 and PMOS transistor P14, and as a result of current flowing in these diodes, the potential of the N-well B1 in the substrate of PMOS transistor P13 and PMOS transistor P14 rises to around 5V. As a result of the potential of the N-well B1 having risen to around 5V, because the gate potential of PMOS transistor P14 is 3V, the substrate potential is relatively higher and the PMOS transistor P14 is turned on. Because PMOS transistor P14 is turned on, the source of PMOS transistor P14 also becomes the voltage (5V) applied to the output terminal 8, and the gate potentials of the PMOS transistor P12 and the PMOS transistor P13 connected to the source of PMOS transistor P14 also become 5V. When the gate potentials of the PMOS transistor P12 and the PMOS transistor P13 become 5V, the PMOS transistor P12 and the PMOS transistor P13 are turned off. Because of this, the 5V supplied to the output terminal 8 is transmitted to the PMOS transistor P1, and there is no flow of leakage current through the substrate of P1. Also, because the N-well B1 in the substrate of PMOS transistor P12 and PMOS transistor P13 is in a floating state, there is no worry of leakage current flowing to the power supply terminal 6 because of the diodes across the drains of PMOS transistor P12 and PMOS transistor P13 and the substrate.

Further, with this circuit construction, when 5V is applied to the source of PMOS transistor P14, i.e. to the output terminal, the NMOS transistors N74, N75 and N76 are connected to the section becoming 5V. There is a possibility of leakage current from the output terminal 8 to the ground terminal 7. However, when the signal supplied to the enable signal input terminal 2 is an 'L' level, the NMOS transistor N76 is always off. Because of this, even if the NMOS transistor N75 is turned on by the signal supplied to the signal input terminal 1 changing to an 'H' level, as long as the signal supplied to the enable signal input terminal 2 is an 'L' level there is no possibility of leakage current flowing from the output terminal 8 to the ground terminal 7 through the path made up of transistors P14, N74, N75 and N76.

Next, when an 'H' level signal is input to the enable signal input terminal 2 as an input signal, if an 'L' level signal is input to the signal input terminal 1 as an input signal the output of the 2-input NAND circuit 4 becomes an 'H' level and the PMOS transistor P1 is turned off. Because the 2-input NOR circuit 5 also has an 'L' level input to one of its input terminals, the output is an 'H' level and the NMOS transistor N1 is turned on. As a result of this, the output terminal 8 outputs an 'L' level signal.

Next, when an 'H' level signal has been input to the enable signal input terminal 2 as an input signal, if an 'L' level is input to the signal input terminal 1 as an input signal the output of the 2-input NAND circuit 4 becomes an 'H' level and the PMOS transistor P1 is turned off. Because an 'L' level signal is input to one of the input terminals of the 2-input NOR circuit 5, the output of the 2-input NOR circuit 5 becomes an 'L' level and the NMOS transistor N1 is turned on. As a result, the output terminal 8 outputs an 'L' level signal.

If an 'H' level is input to the signal input terminal 1 as an input signal, the output of the 2-input NAND circuit 4 becomes an 'L' level and the PMOS transistor P1 is turned on. The output of the 2-input NOR circuit 5 becomes an 'L' level and the NMOS transistor N1 is turned off. Also, because the NMOS transistor N11 is turned on, the 'L' level at the output of the 2-input NAND circuit 4 is supplied to the gate electrodes of the PMOS transistor P12 and the PMOS transistor P13 because of the diodes across the sources of PMOS transistor P12 and the PMOS transistor P13, the potential of the N-well in the substrate of PMOS transistors P12, P13 and P14 rises to around 3V, which means that the PMOS transistor P12 and the PMOS transistor P13 are turned on. As a result, the output terminal 8 outputs an 'H' level (3V) signal.

Here, if the case is considered where the signal supplied to the signal input terminal 1 changes from an 'L' level to an 'H' level while an 'H' level signal is being supplied to the enable signal input terminal 2 as an input signal, the NMOS transistor N74 is always on and the gate potential of the NMOS transistor N75 changes from an 'L' level to an 'H' level in response to the change in the input signal IN. Also, because the signal supplied to the enable signal input terminal 2 is an 'H' level, the NMOS transistor N76 is turned on. If the gate potential of the NMOS transistor N75 changes to an 'H' level the NMOS transistor N75 is turned on, and because NMOS transistor N74 and NMOS transistor N75 are both turned on the potential supplied to the gate of PMOS transistor P13 changes from an 'H' level to an 'L' level, but not through the 2-input NAND circuit 4 and NMOS transistor N11. That is, with an 'H' level signal supplied as an input signal to the enable signal input terminal 2, when the signal supplied to the signal input terminal 1 changes from an 'L' level to an 'H' level, the operation of switching the PMOS transistor P13 from the OFF state to the ON state is faster than in the first and second embodiments.

According to the output circuit of the third embodiment of the present invention, for every input signal supplied to the input terminals, the same output signals are output from the output terminal 8 as in the conventional art. Also, even if a potential (5V) higher than the potential of the power supply terminal 6 is input to the output terminal 8 from an external circuit etc., the PMOS transistor P12 and the PMOS transistor P13 are turned off as a result of the fact that the potential of the N-well B1 at the substrate of PMOS transistors P12, P13 and P14 rises to around 5V, and the flow of leakage current from the output terminal 8 to the power supply terminal 6 can be prevented. There is also no fear of leakage current flowing through the 2-input NAND circuit 4, because of NMOS transistor N11.

Also, when the input signal supplied to the signal input terminal 1 changes from an 'L' level to an 'H' level (i.e. the output level changes from an 'L' level to an 'H' level) with the signal supplied to the enable signal input terminal 2 being an 'H' level, the potential supplied to the gate of PMOS transistor P13 changes from an 'H' level to an 'L' level without passing through the 2-input NAND circuit 4 and the NMOS transistor N11, which means that the switching of PMOS transistor P13 from the Off state to the ON state is faster, and the change in output signal is also faster.

Also, with this circuit construction, when the signal supplied to the enable signal input terminal 2 is an 'L' level, NMOS transistor N76 is always turned off. This means that even if the signal supplied to the signal input terminal 1 changes to an 'H' level, it is impossible for there to be any flow of leakage current from the output terminal 8 to the ground terminal 7 as long as the signal supplied to the enable signal input terminal 2 is an 'L' level.

Embodiments of the present invention are not limited to the tri-state output circuits described in this specification, and similar effects will be obtained if it is applied to a normal push-pull output circuit. Because the NMOS transistors N11 and N12 in FIG. 1 and FIG. 2, and the NMOS transistors N11, N12 and N74 in FIG. 7 are provided to prevent damage to other elements by the application of a 5V voltage to the output terminal 8, if there is no danger of the other components being damaged by a voltage of 5V then there is no real obstacle to the effect of reducing leakage current even if they are removed.

FIELD OF INDUSTRIAL UTILIZATION

As has been described above, the present invention is applicable as an output circuit for a semiconductor device, and particularly as an output circuit in a 5V to 3V interface section, etc.

I claim:

1. An output circuit comprising:
   a first MOS transistor having a gate connected to a first node, one terminal connected to a first power supply terminal, another terminal connected to a second node, and a substrate terminal connected to said first power supply terminal;
   a second MOS transistor having a gate connected to said first node, one terminal connected to said second node, another terminal connected to an output terminal and a substrate terminal connected to a third node having no fixed value resulting in a floating state; and
   a third MOS transistor having a gate connected to said first power supply terminal, one terminal connected to said first node, another terminal connected to said output terminal, and a substrate terminal connected to said third node.

2. The output circuit as disclosed in claim 1, further comprising a fourth MOS transistor having a gate connected to said first node, one terminal connected to said second node, another terminal connected to said third node, and a substrate terminal connected to said third node.

3. The output circuit as disclosed in claim 1, further comprising a fourth MOS transistor having a gate connected to said first power supply terminal, one terminal connected to said third node, another terminal connected to said output terminal, and a substrate connected to said third node.

4. The output circuit as disclosed in claim 1, further comprising:
   a fourth MOS transistor having a gate connected to said first node, one terminal connected to said second node, another terminal connected to said third node, and a substrate terminal connected to said third node; and
   a fifth MOS transistor having a gate connected to said first power supply terminal, one terminal connected to said third node, another terminal connected to said output terminal, and a substrate connected to said third node.

5. An output circuit, comprising:
   a first input signal terminal for receiving a first input signal;
   a second input signal terminal for receiving a second input signal;
   a first MOS transistor having a gate connected to a first node, one terminal connected to a first power supply terminal having a first potential, another terminal connected to a second node, and a substrate terminal connected to said first power supply terminal having said first potential;
   a second MOS transistor having a gate connected to said first node, one terminal connected to said second node, another terminal connected to an output terminal and substrate terminal connected to a third node in a floating state;
   a third MOS transistor having a gate connected to said first power supply terminal having said first potential, one terminal connected to said first node, another terminal connected to said output terminal, and a substrate terminal connected to said third node;
   a fourth MOS transistor having a gate connected to said first input terminal, one terminal connected to said first node, another terminal connected to a fourth node and a substrate terminal connected to a second power supply terminal having a second potential; and
   a fifth MOS transistor having a gate connected to said second input terminal, one terminal connected to said fourth node, another terminal connected to said second power supply terminal having said second potential and a substrate connected to said second power supply terminal having said second potential.

6. The output circuit as disclosed in claim 5, further comprising a sixth MOS transistor having a gate connected to said first node, one terminal connected to a second node, another terminal connected to said third node and a substrate terminal connected to said third node.

7. The output circuit as disclosed in claim 5, further comprising a sixth MOS transistor having a gate connected to said first power supply terminal having said first potential, one terminal connected to said third node, another terminal connected to said output terminal and a substrate terminal connected to said third node.

8. The output circuit as disclosed in claim 5, further comprising:
   a sixth MOS transistor having a gate connected to said first node, one terminal connected to a second node, another terminal connected to said third node and a substrate terminal connected to said third node; and
   a seventh MOS transistor having a gate connected to said first power supply terminal having said first potential, one terminal connected to said third node, another terminal connected to said output terminal and a substrate terminal connected to said third node.

9. An output circuit comprising:
   a first MOS transistor having a gate connected to a first node, one terminal connected to a first power supply terminal, and another terminal connected to a second node;
   a second MOS transistor, formed inside a floating state well, and having a gate connected to said first node, one terminal connected to said second node and another terminal connected to an output terminal; and a third MOS transistor, formed inside said floating state well, and having a gate connected to said first power supply terminal, one terminal connected to said first node and another terminal connected to said output terminal.

10. The output circuit as disclosed in claim 9, further comprising a fourth MOS transistor, formed inside said floating state well, and having a gate connected to said first power supply terminal, one terminal connected to said second node and another terminal connected to said floating state well.

11. The output circuit as disclosed in claim 9, further comprising a fourth MOS transistor, formed inside said floating state well, and having a gate connected to said first power supply terminal, one terminal connected to connected to said floating state well and another terminal connected to said output terminal.

12. The output circuit as disclosed in claim 9, further comprising:
a fourth MOS transistor, formed inside said floating state well, and having a gate connected to said first power supply terminal, one terminal connected to said second node and another terminal connected to said floating state well; and
a fifth MOS transistor, formed inside said floating state well, and having a gate connected to said first power supply terminal, one terminal connected to connected to said floating state well and another terminal connected to said output terminal.

13. An output circuit, comprising:
a first input signal terminal for receiving a first input signal;
a second input signal terminal for receiving a second input signal;
a first MOS transistor having a gate connected to a first node, one terminal connected to a first power supply terminal having a first potential, and another terminal connected to a second node;
a second MOS transistor, formed inside said floating state well, and having a gate connected to said first node, one terminal connected to said second node, and another terminal connected to an output terminal;
a third MOS transistor, formed inside said floating state well, and having a gate connected to said first power supply terminal having said first potential, one terminal connected to said first node, and another terminal connected to said output terminal;
a fourth MOS transistor having a gate connected to said first input terminal, one terminal connected to said first node, and another terminal connected to a fourth node; and
a fifth MOS transistor having a gate connected to said second input terminal, one terminal connected to said fourth node, and another terminal connected to said second power supply terminal having said second potential.

14. The output circuit as disclosed in claim 13, further comprising a sixth MOS transistor, formed inside said floating state well, and having a gate connected to said first node, one terminal connected to a second node and another terminal connected to said floating state well.

15. The output circuit as disclosed in claim 13, further comprising a sixth MOS transistor, formed inside said floating well state, and having a gate connected to said first power supply terminal having said first potential, one terminal connected to said floating state well, and another terminal connected to said output terminal.

16. The output circuit as disclosed in claim 13, further comprising;
a sixth MOS transistor, formed inside said floating state well, and having a gate connected to said first node, one terminal connected to said second node, and another terminal connected to said floating state well; and
a seventh MOS transistor, formed inside said floating state well, and having a gate connected to said first power supply terminal having said first potential, one terminal connected to said floating state well, and another terminal connected to said output terminal.

17. An output circuit comprising:
a first MOS transistor having a gate connected to a first node, one terminal connected to a first power supply terminal, another terminal connected to a second node, and a substrate terminal connected to said first power supply terminal;
a second MOS transistor having a gate connected to a third node, one terminal connected to said second node, another terminal connected to an output terminal and a substrate terminal connected to a fourth node in a floating state;
a third MOS transistor having a gate connected to said first power supply terminal, one terminal connected to said third node, another terminal connected to said output terminal, and a substrate terminal connected to said fourth node; and
a fourth MOS transistor having a gate connected to said first power supply terminal, one terminal connected to said first node, another terminal connected to said third node, and a substrate terminal connected to said first power supply terminal.

18. The output circuit as disclosed in claim 17, further comprising:
a fifth MOS transistor having a gate connected to said third node, one terminal connected to said second node, another terminal connected to said fourth node and a substrate terminal connected to said fourth node.

19. The output circuit as disclosed in claim 17, further comprising:
a fifth MOS transistor having a gate connected to said first power supply terminal, one terminal connected to said fourth node, another terminal connected to said output terminal and a substrate terminal connected to said fourth node.

20. The output circuit as disclosed in claim 17, further comprising:
a fifth MOS transistor having a gate connected to said third node, one terminal connected to said second node, another terminal connected to said fourth node and a substrate terminal connected to said fourth node; and
a sixth MOS transistor having a gate connected to said first power supply terminal, one terminal connected to said fourth node, another terminal connected to said output terminal and a substrate terminal connected to said fourth node.

21. An output circuit, comprising:
a first input signal terminal for receiving a first input signal;
a second input signal terminal for receiving a second input signal;
a first MOS transistor having a gate connected to a first node, one terminal connected to a first power supply terminal having a first potential, another terminal connected to a second node, and a substrate terminal connected to said first power supply terminal having said first potential;

a second MOS transistor having a gate connected to said third node, one terminal connected to said second node, another terminal connected to an output terminal and a substrate terminal connected to a fourth node in a floating state;

a third MOS transistor having a gate connected to said first power supply terminal having said first potential, one terminal connected to said third node, another terminal connected to said output terminal, and a substrate terminal connected to said fourth node;

a fourth MOS transistor having a gate connected to said first power supply terminal, one terminal connected to said first node, another terminal connected to a third node and a substrate terminal connected to said first power supply terminal having said first potential;

a fifth MOS transistor having a gate connected to said first input terminal, one terminal connected to said third node, another terminal connected to a fifth node and a substrate terminal connected to said second power supply terminal having said second potential; and a sixth MOS transistor having a gate connected to said second input terminal, one terminal connected to said fifth node, another terminal connected to said second power supply terminal having said second potential and a substrate terminal connected to said second power supply terminal having said second potential.

22. The output circuit as disclosed in claim 21, further comprising:

a seventh MOS transistor having a gate connected to said third node, one terminal connected to a second node, another terminal connected to said fourth node, and a substrate terminal connected to said fourth node.

23. The output circuit as disclosed in claim 21, further comprising:

a seventh MOS transistor having a gate connected to said first power supply terminal having said first potential, one terminal connected to said fourth node, another terminal connected to said output terminal, and a substrate terminal connected to said fourth node.

24. The output circuit as disclosed in claim 21, further comprising:

a seventh MOS transistor having a gate connected to said third node, one terminal connected to a second node, another terminal connected to said fourth node, and substrate terminal connected to said fourth node; and an eighth MOS transistor having a gate connected to said first power supply terminal having said first potential, one terminal connected to said fourth node, another terminal connected to said output terminal, and a substrate terminal connected to said fourth node.

25. An output circuit comprising:

a first MOS transistor having a gate connected to a first node, one terminal connected to a first power supply terminal, and another terminal connected to a second node;

a second MOS transistor having a gate connected to said first power supply terminal, one terminal connected to said first node, another terminal connected to a third node, and a substrate terminal connected to said first power supply terminal;

a third MOS transistor, formed inside a floating state well, having a gate connected to said third node, one terminal connected to said second node, and another terminal connected to an output terminal; and a fourth MOS transistor, formed inside said floating state well, having a gate connected to said first power supply terminal, one terminal connected to said third node, and another terminal connected to said output terminal.

26. The output circuit as disclosed in claim 25, further comprising:

a fifth MOS transistor, formed inside said floating state well, having a gate connected to said third node, one terminal connected to said second node, and another terminal connected to said floating state well.

27. The output circuit as disclosed in claim 25, further comprising:

a fifth MOS transistor, formed inside said floating state well, having a gate connected to said first power supply terminal, one terminal connected to said floating state well, and another terminal connected to said output terminal.

28. The output circuit as disclosed in claim 25, further comprising:

a fifth MOS transistor, formed inside said floating state well, having a gate connected to said third node, one terminal connected to said second node, and another terminal connected to said floating state well; and a sixth MOS transistor, formed inside said floating state well, having a gate connected to said first power supply terminal, one terminal connected to said floating state well, and another terminal connected to said output terminal.

29. An output circuit, comprising:

a first signal input terminal for receiving a first input signal;

a second signal input terminal for receiving a second input signal;

a first MOS transistor having a gate connected to a first node, one terminal connected to a first power supply terminal having a first potential, and another terminal connected to a second node;

a second MOS transistor having a gate connected to said first power supply terminal, one terminal connected to said first node, another terminal connected to a third node, and a substrate terminal connected to said first power supply terminal;

a third MOS transistor, formed inside a floating state well, having a gate connected to said third node, one terminal connected to said second node and another terminal connected to an output terminal;

a fourth MOS transistor, formed inside said floating state well, having a gate connected to said first power supply terminal having said first potential, one terminal connected to said third node, and another terminal connected to said output terminal;

a fifth MOS transistor having a gate connected to said first signal input terminal, one terminal connected to said third node, and another terminal connected to a fourth node; and a sixth MOS transistor having a gate connected to said second signal input terminal, one terminal connected to said fourth node, and another terminal connected to said second power supply terminal having said second potential.

30. The output circuit as disclosed in claim 29, further comprising:
   a seventh MOS transistor, being formed inside said floating state well, having a gate connected to said third node, one terminal connected to said second node, and another terminal connected inside said floating state well.

31. The output circuit as disclosed in claim 29, further comprising:
   a seventh MOS transistor, being formed inside said floating state well, having a gate connected to said first power supply terminal having said first potential, one terminal connected to said floating state gate, and another terminal connected to said output terminal.

32. The output circuit as disclosed in claim 29, further comprising:
   a seventh MOS transistor, being formed inside said floating state well, having a gate connected to said third node, one terminal connected to said second node, and another terminal connected inside said floating state well; and
   an eighth MOS transistor, being formed inside said floating state well, having a gate connected to said first power supply terminal having said first potential, one terminal connected to said floating state gate, and another terminal connected to said output terminal.

* * * * *